(12) United States Patent
Hattori et al.

(10) Patent No.: US 11,418,111 B2
(45) Date of Patent: Aug. 16, 2022

(54) POWER CONVERSION CIRCUIT BOARD AND ELECTRIC COMPRESSOR

(71) Applicant: MITSUBISHI HEAVY INDUSTRIES THERMAL SYSTEMS, LTD., Tokyo (JP)

(72) Inventors: Makoto Hattori, Kiyosu (JP); Hiroyuki Kamitani, Kiyosu (JP); Hiroto Higuchi, Kiyosu (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 16/664,638

(22) Filed: Oct. 25, 2019

(65) Prior Publication Data

US 2020/0059156 A1 Feb. 20, 2020

Related U.S. Application Data

(63) Continuation of application No. 15/567,283, filed as application No. PCT/JP2016/054257 on Feb. 15, 2016, now abandoned.

(30) Foreign Application Priority Data

Apr. 20, 2015 (JP) .............................. JP2015-086292

(51) Int. Cl.
*H02M 1/44* (2007.01)
*H02M 7/48* (2007.01)
(Continued)

(52) U.S. Cl.
CPC ............. *H02M 1/44* (2013.01); *H02M 7/003* (2013.01); *H02M 7/48* (2013.01); *H02M 7/537* (2013.01);
(Continued)

(58) Field of Classification Search
CPC .......... H02M 1/44; H02M 7/003; H02M 7/48; H02M 7/537; H02P 27/06; H05K 1/0256; H05K 7/1432
(Continued)

(56) References Cited

U.S. PATENT DOCUMENTS 9,277,647 B2   3/2016  Fujimoto
2008/0087458 A1*  4/2008  Hattori ................. H05K 1/0231
                                                                174/260
(Continued)

FOREIGN PATENT DOCUMENTS

CN           1200010 A     11/1998
CN         101162855 A      4/2008
(Continued)

OTHER PUBLICATIONS

Final Office Action issued in copending U.S. Appl. No. 15/567,283 dated Jun. 27, 2019.
(Continued)

*Primary Examiner* — Muhammad S Islam
*Assistant Examiner* — Zemenay T Truneh
(74) *Attorney, Agent, or Firm* — Birch, Stewart, Kolasch & Birch, LLP

(57) ABSTRACT

A power conversion circuit board (1) is a circuit board on which a power conversion circuit configured to convert a direct current into an alternating current is mounted. A low-voltage circuit (10b) to which a low voltage is applied and a high-voltage circuit (10a) to which a high voltage is applied are separately disposed in different areas on the same circuit board surface. Furthermore, part of wiring of the high-voltage circuit (10a) is formed on the circuit board surface, and the other wiring is constituted by a bus bar provided at a predetermined distance from the circuit board surface.

6 Claims, 6 Drawing Sheets

(51) Int. Cl.
*H05K 1/02* (2006.01)
*H05K 7/14* (2006.01)
*H02M 7/00* (2006.01)
*H02M 7/537* (2006.01)
*H02P 27/06* (2006.01)

(52) U.S. Cl.
CPC ........... *H02P 27/06* (2013.01); *H05K 1/0256* (2013.01); *H05K 7/1432* (2013.01); *H05K 2201/10272* (2013.01)

(58) Field of Classification Search
USPC ....................................................... 318/500
See application file for complete search history.

(56) References Cited

U.S. PATENT DOCUMENTS

| | | | |
|---|---|---|---|
| 2009/0213564 A1 | 8/2009 | Kakuda et al. | |
| 2009/0298357 A1 | 12/2009 | Tachikawa et al. | |
| 2010/0014988 A1 | 1/2010 | Tsutsui et al. | |
| 2010/0223947 A1 | 9/2010 | Shibuya | |
| 2011/0211980 A1* | 9/2011 | Shibuya | H05K 7/1432 417/410.1 |
| 2014/0247574 A1 | 9/2014 | Tamaki | |
| 2014/0332261 A1* | 11/2014 | Fujimoto | H01G 4/248 174/260 |
| 2015/0333604 A1 | 11/2015 | Hattori et al. | |
| 2015/0349613 A1 | 12/2015 | Hattori et al. | |
| 2016/0020657 A1 | 1/2016 | Hattori et al. | |
| 2016/0020680 A1* | 1/2016 | Hattori | H02K 5/225 310/72 |

FOREIGN PATENT DOCUMENTS

| | | | |
|---|---|---|---|
| CN | 101589541 A | | 11/2009 |
| JP | 8-204360 A | | 8/1996 |
| JP | 2003/324030 | | 11/2003 |
| JP | 2005-302789 A | | 10/2005 |
| JP | 2007-198341 A | | 8/2007 |
| JP | 2008-99480 A | | 4/2008 |
| JP | 2009-032821 A | | 2/2009 |
| JP | 2009-201257 A | | 9/2009 |
| JP | 2009-290117 A | | 12/2009 |
| JP | 2011-217483 A | | 10/2011 |
| JP | 2011-229397 A | | 11/2011 |
| JP | 2011-249412 A | | 12/2011 |
| JP | 5039356 B2 | | 10/2012 |
| JP | 5186029 B2 | | 4/2013 |
| JP | 2014-161188 A | | 9/2014 |
| JP | 2014-165944 A | | 9/2014 |
| JP | 2014-217223 A | | 11/2014 |
| JP | 2014-217224 A | | 11/2014 |

OTHER PUBLICATIONS

International Search Report and Written Opinion of the International Searching Authority (Forms PCT/ISA/210 and PCT/ISA/237) for International Application No. PCT/JP2016/054257, dated Apr. 26, 2016, with English translations.

Non-Final Office Action issued in copending U.S. Appl. No. 15/567,283 dated Nov. 5, 2018.

* cited by examiner

POWER CONVERSION CIRCUIT BOARD AND ELECTRIC COMPRESSOR This application is a continuation application of copending U.S. patent application Ser. No. 15/567,283 filed Oct. 17, 2017, which application claims priority to Patent Application No. 2015-086292 filed in Japan on Apr. 20, 2015, of which the contents are incorporated herein by reference.

TECHNICAL FIELD

The present invention relates to a power conversion circuit board and an electric compressor.

BACKGROUND ART

A vehicle-mounted air conditioner needs to save a large space due to the need for housing various structural devices in a confined space in a vehicle, for example. Thus, an integrated electric compressor has been provided for the purpose of saving a larger space in recent years (for example, see Patent Documents 1 and 2). In the integrated electric compressor, a compressor that forms a vehicle-mounted air conditioner, a motor for driving the compressor, and a circuit board for controlling the compressor are integrally formed.

CITATION LIST

Patent Document

Patent Document 1: JP-A-2008-099480
Patent Document 2: JP-A-2011-229397

SUMMARY OF INVENTION

Technical Problems

The vehicle-mounted electric compressor described above includes the compressor, the motor, and the circuit board in close contact to one another. Accordingly, a degree of vibration propagated to the circuit board increases during operation. The circuit board thus needs to have higher vibration resistance as space savings proceed.

Meanwhile, it is desired that an influence of electromagnetic noise, which may be generated by the electric compressor, on an external device is further reduced.

The present invention has been made in view of the above-mentioned problems, and an object thereof is to provide a power conversion circuit board and an electric compressor capable of reducing an influence of electromagnetic noise on an external device and further improving vibration resistance.

Solution to Problems

One aspect of the present invention is a power conversion circuit board that is a circuit board on which a power conversion circuit configured to convert a direct current into an alternating current is mounted. A low-voltage circuit to which a low voltage is applied and a high-voltage circuit to which a high voltage is applied are disposed in different areas on the same circuit board surface. Fixing holes are formed at least in four corners of the circuit board surface and in an area other than the four corners, and a grounding land provided at an edge of each of the fixing hole is formed.

In this way, positions for being fixed (screwed) to the other part are increased. This improves fixing performance of the power conversion circuit board to a housing of the other part. A ground potential of ground wiring is further stabilized because the positions grounded through the grounding land are distributed on the whole circuit board surface. Therefore, an influence of electromagnetic noise on an external device can be reduced, and vibration resistance can be further increased.

According to one aspect of the present invention, the high-voltage circuit includes series capacitor groups each formed of a plurality of capacitor elements connected in series between power source wiring and ground wiring.

In this way, a voltage applied to one capacitor element is divided and reduced, so that the high-voltage circuit can have higher withstand voltage characteristics.

According to one aspect of the present invention, the series capacitor groups are mounted in the vicinity of the fixing holes.

In this way, a position grounded through the land provided at the edge of the fixing hole is close to a position connected to the series capacitor group on the ground wiring in the high-voltage circuit. This can further stabilize the ground potential of the whole ground wiring of the high-voltage circuit, and thus an influence of the electromagnetic noise on the external device can be further suppressed.

According to one aspect of the present invention, the series capacitor groups are mounted in the same positions on each of a front surface side and a back surface side of the circuit board. Two groups of the series capacitor groups mounted in the same positions on the front surface side and the back surface side are mounted with the plurality of capacitor elements having the same arrangement pattern.

In this way, the series capacitor groups on the front surface side and the back surface side can have the same capacitance value, which also includes floating capacitance according to the arrangement pattern.

In one aspect of the present invention, in the power conversion circuit board described above, wiring of the high-voltage circuit from high-voltage input terminals to switching elements is formed on the circuit board surface while wiring of the high-voltage circuit from the switching elements to high-voltage output terminals is constituted by a bus bar provided at a predetermined distance from the circuit board surface.

In such a configuration, the electromagnetic noise generated by driving the switching elements is absorbed between the wiring formed on the circuit board surface and the bus bar provided at the predetermined distance from the circuit board surface. This can suppress the electromagnetic noise to be emitted to the outside.

In one aspect of the present invention, in the power conversion circuit board described above, the wiring from the high-voltage input terminals to the switching elements and the wiring from the switching elements to the high-voltage output terminals are disposed crossing each other.

In such a configuration, the electromagnetic noise generated by driving the switching elements is effectively absorbed by a portion where the wirings cross each other. This can further suppress the electromagnetic noise to be emitted to the outside. The region where the wirings overlap with each other allows the region of the power conversion circuit board occupied by the high-voltage circuit to be compact and integrated into one. Therefore, the whole power conversion circuit board can further save space.

One aspect of the present invention is an electric compressor that includes:

the power conversion circuit board described above; and a motor configured to operate on the basis of an AC power supplied from the power conversion circuit board.

Advantageous Effects of Invention

The power conversion circuit board and the electric compressor described above can reduce an influence of the electromagnetic noise on the external device and further improve the vibration resistance.

DESCRIPTION OF EMBODIMENTS

First Embodiment

Figure 1:
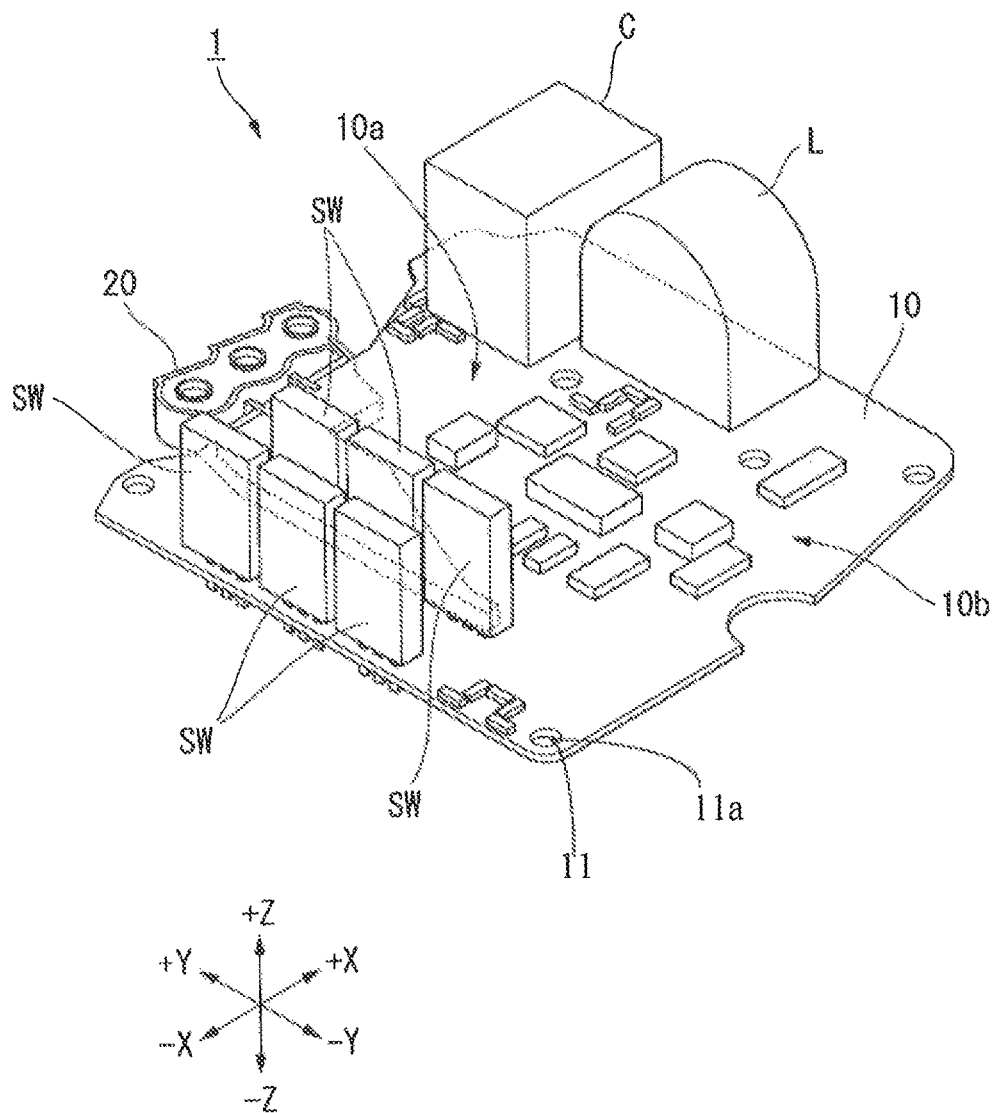
FIG. 1 is a perspective view of a power conversion circuit board according to a first embodiment.

A power conversion circuit board according to a first embodiment is described below while referencing FIGS. 1 to 7.
Overall Structure FIG. 1 is a perspective view of the power conversion circuit board according to the first embodiment.

Figure 2:
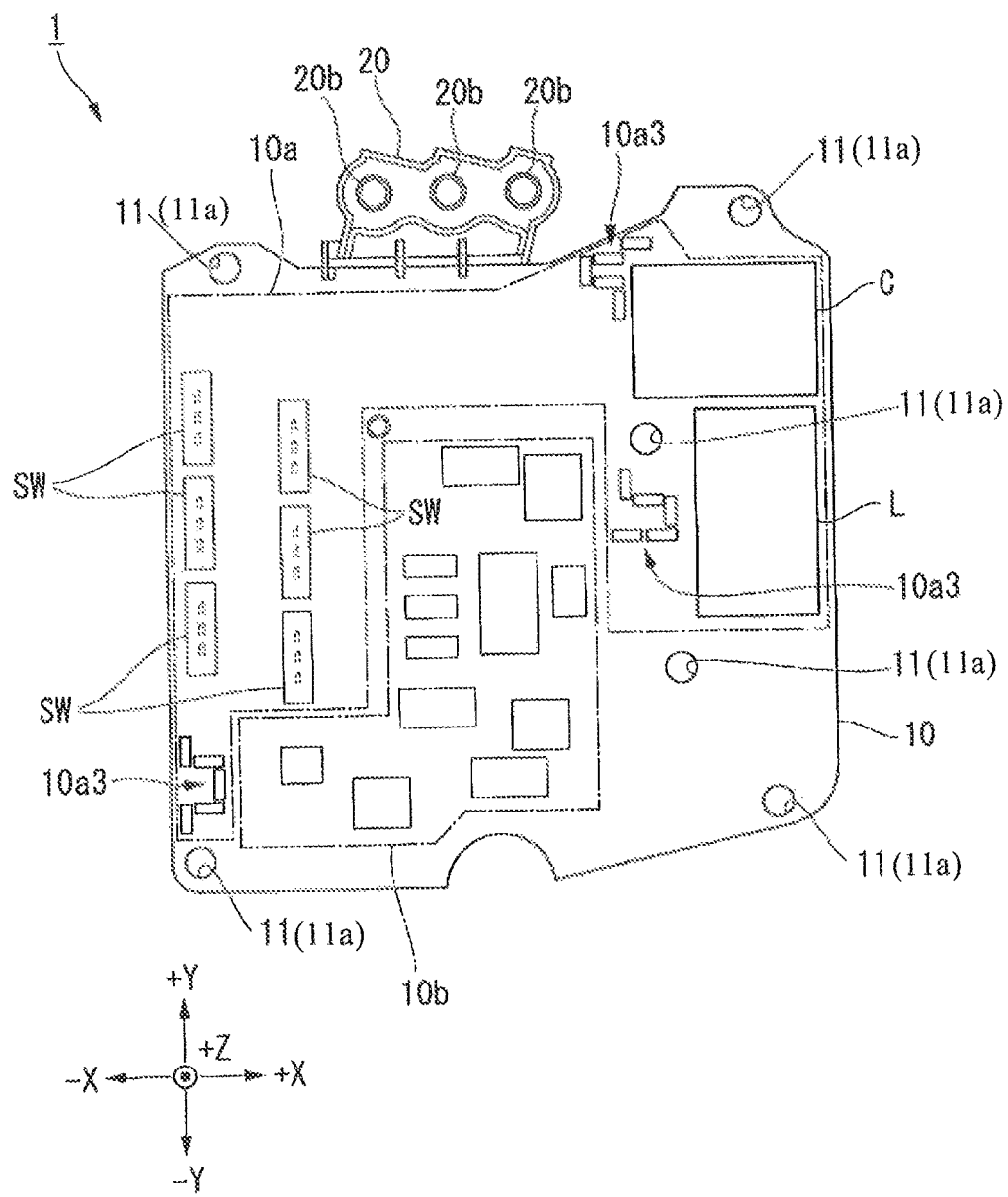
FIG. 2 is a plan view of the power conversion circuit board according to the first embodiment.

FIG. 2 is a plan view of the power conversion circuit board according to the first embodiment.

Figure 3:
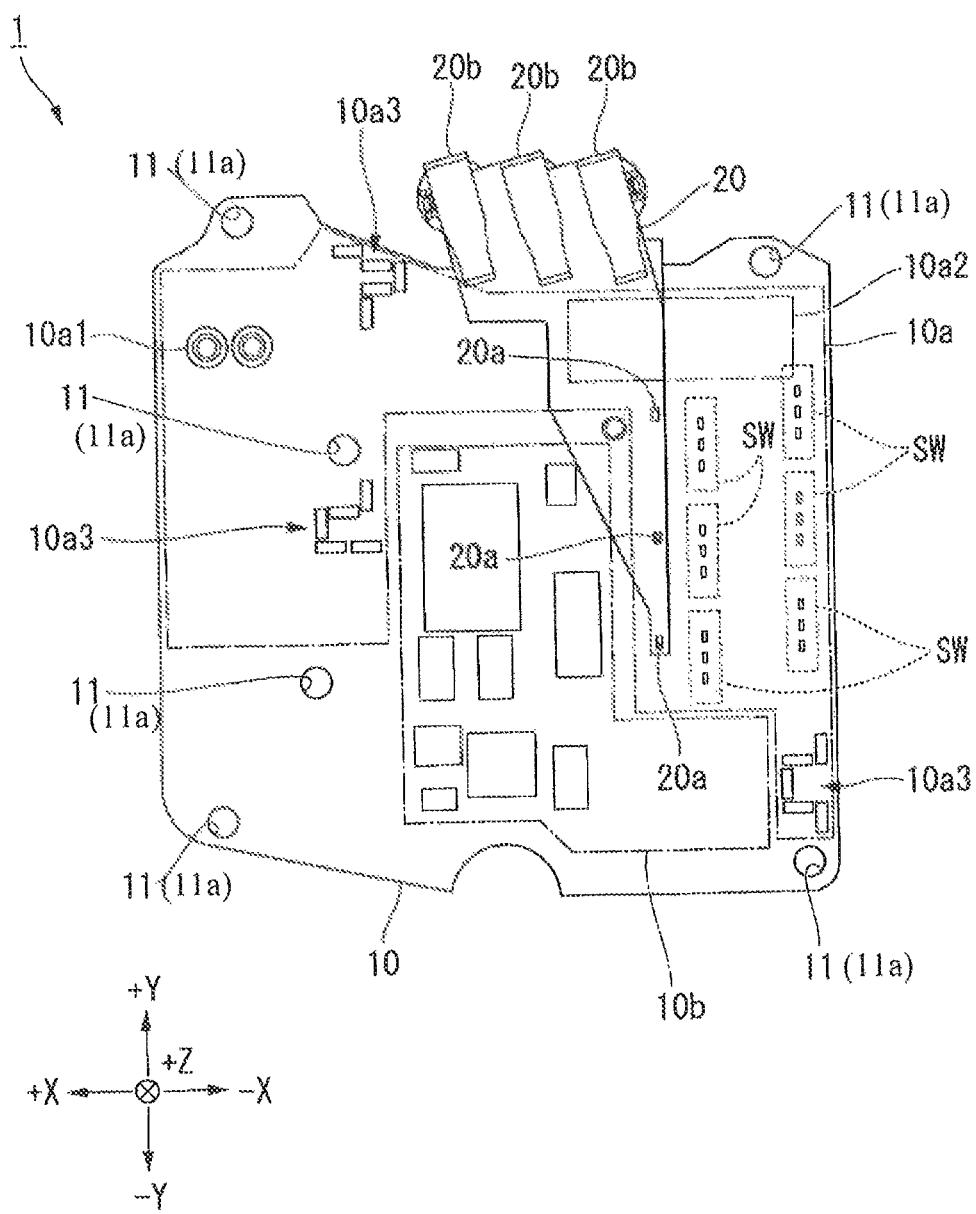
FIG. 3 is a bottom view of the power conversion circuit board according to the first embodiment.

FIG. 3 is a bottom view of the power conversion circuit board according to the first embodiment.

Figure 4:
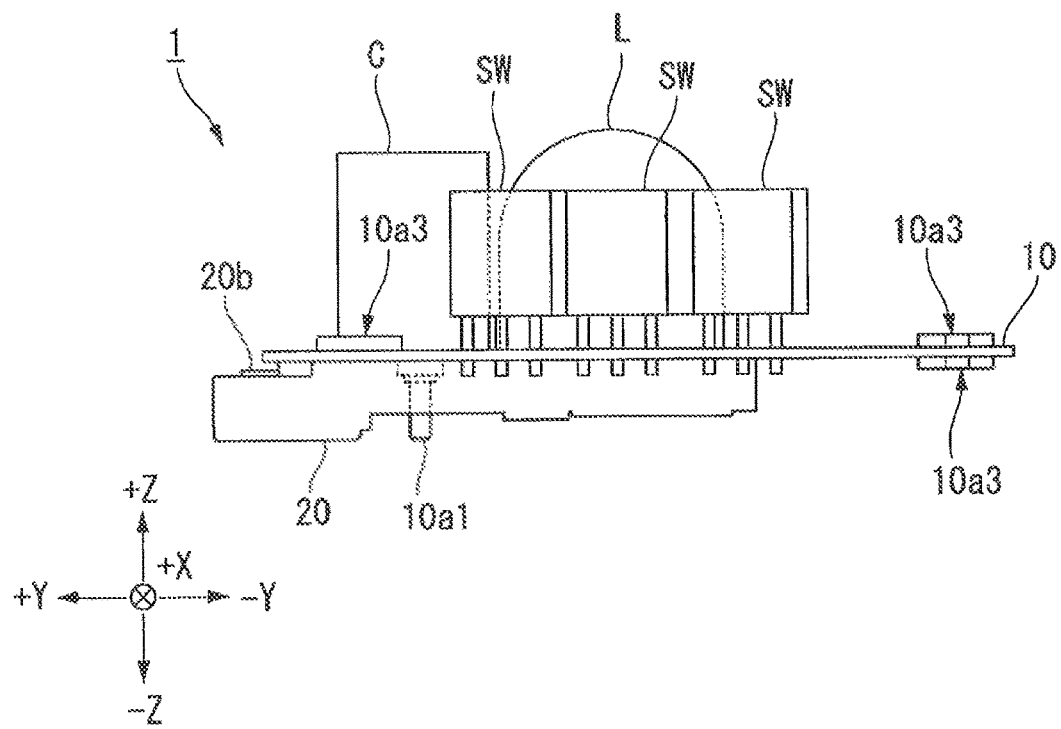
FIG. 4 is a side view of the power conversion circuit board according to the first embodiment.

FIG. 4 is a side view of the power conversion circuit board according to the first embodiment.

Figure 5:
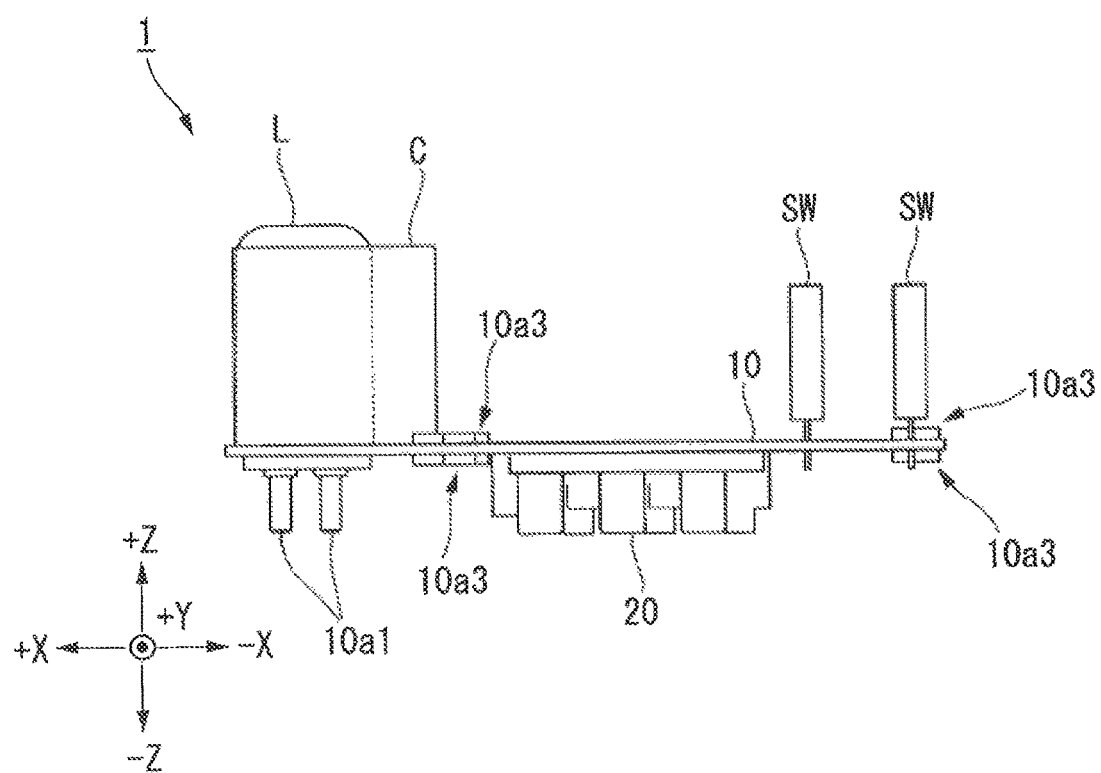
FIG. 5 is a front view of the power conversion circuit board according to the first embodiment.

FIG. 5 is a front view of the power conversion circuit board according to the first embodiment.

A power conversion circuit board 1 according to the first embodiment is a circuit board that forms an inverter for converting a DC power supplied from the outside through an input terminal (described later) into a three-phase AC power. Herein, the power conversion circuit board 1 according to the first embodiment is integrally mounted on an electric compressor with an AC motor that operates on the basis of the three-phase AC power output by the power conversion circuit board 1.

The electric compressor is used in, for example, an air conditioner mounted in a vehicle (car air conditioner). In this case, the electric compressor (the power conversion circuit board 1) receives an input of the DC power from, for example, a battery mounted in the vehicle.

As illustrated in FIGS. 1 to 5, the power conversion circuit board 1 includes a circuit board main portion 10 and a bus bar support member 20.

The circuit board main portion 10 is a circuit board on which various circuit elements are mounted. The circuit elements form a power conversion circuit (inverter) that converts a direct current into an alternating current. As illustrated in, for example, FIG. 1, part of a high-voltage circuit 10a to which a high voltage is applied and a low-voltage circuit 10b to which a low voltage is applied are separately disposed in different areas on a circuit board surface of the circuit board main portion 10 (including both of a surface on a +Z direction side and a surface on a −Z direction side).

The high-voltage circuit 10a is a high-power circuit to which a high voltage needed for driving the AC motor, which is not illustrated, is applied. Specifically, a DC high voltage input from, for example, the battery mounted in the vehicle is applied to the high-voltage circuit 10a. The input DC high voltage is converted into a three-phase AC power for driving the AC motor through switching elements SW.

Each of the switching elements SW switches between an ON state that allows a flow of current and an OFF state that shuts off current on the basis of a driving signal (gate input) from the low-voltage circuit 10b (described later). Two switching elements SW are provided for each of an U phase, a V phase, and a W phase that constitute a three-phase alternating current. Accordingly, six switching elements SW in total are mounted on the circuit board surface of the circuit board main portion 10. Each of the switching elements SW repeats ON and OFF at prescribed timing to supply the three-phase (U phase, V phase, and W phase) AC power to the AC motor.

Note that the switching element SW is typified by, for example, an insulated gate bipolar transistor (IGBT), but may be a bipolar transistor or a metal-oxide-semiconductor field effect transistor (MOSFET), for example.

On the other hand, the low-voltage circuit 10b is a small-signal circuit that operates by a voltage lower than that of the high-voltage circuit 10a. Specifically, a control chip such as a microcomputer and various sensors such as a current sensor are mounted on the low-voltage circuit 10b, and the low-voltage circuit 10b operates by the application of a DC low voltage. For example, the microcomputer mounted on the low-voltage circuit 10b outputs a predetermined driving signal in response to detection results of the various sensors to each of the switching elements SW to control the switching element SW such that a desired three-phase AC power is generated according to situations.

Note that the circuit board main portion 10 according to the first embodiment is a multilayer wiring circuit board that includes a plurality of layers layered. In the area of the circuit board main portion 10 where the high-voltage circuit 10a is mounted, at least a power source pattern layer and a ground (GND) pattern layer are layered. The power source pattern layer is patterned with power source wiring to which the above-described high voltage is applied. The GND pattern layer is patterned with ground wiring that is grounded.
Structure of High-Voltage Circuit Next, a structure of the high-voltage circuit 10a will be described in more detail while referencing FIGS. 1 to 5.

As illustrated in FIGS. 1 to 5, the high-voltage circuit 10a is formed of high-voltage input terminals 10a1, an RC circuit 10a2, the switching elements SW, the bus bar support member 20, a capacitor C. and an inductor L that are electrically connected to one another.

The following description is given while mainly referencing FIG. 3 when the power conversion circuit board 1 is seen from a bottom surface side (−Z direction side). Herein, an +X direction side in FIG. 3 is indicated as a left side (left end side) and an −X direction side therein is indicated as a right side (right end side). Also, a +Y direction side in FIG. 3 is indicated as an upper side (upper end side) and a −Y direction side therein is indicated as a lower side (lower end side).

The high-voltage input terminals $10a1$ are mounted on the circuit board surface on a back surface side (−Z direction side) of the circuit board main portion 10 and on the left end side (+X direction side) of the circuit board main portion 10 (see FIG. 3). The high-voltage input terminals $10a1$ are electrically connected to a separately mounted battery, and a DC high voltage is applied to the high-voltage input terminals $10a1$ from the battery. Note that the capacitor C and the inductor L for high voltage are mounted on the circuit board surface on the side (+Z direction side) opposite from the surface on which the high-voltage input terminals $10a1$ are mounted (see FIG. 2). The capacitor C and the inductor L for high voltage can stabilize the DC high voltage from the battery.

The DC high voltage input from the high-voltage input terminals $10a1$ is input, through the RC circuit $10a2$ disposed on the right end side (−X direction side) of the high-voltage circuit $10a$, to the six switching elements SW mounted on the same right end side.

The RC circuit $10a2$ is a circuit that includes a resistance element and a capacitor element electrically connected to each other, and functions as a filter. The RC circuit $10a2$ is mounted on the circuit board surface of the circuit board main portion 10, and at least part of the RC circuit $10a2$ is mounted in a space between the bus bar support member 20, which will be described below, and the circuit board main portion 10 (see FIG. 3, for example).

The six switching elements SW are mounted on the lower side (−Y direction side) of the RC circuit $10a2$ on the circuit board main portion 10.

The bus bar support member 20 is disposed on the circuit board surface on the back surface side (−Z direction side) of the circuit board main portion 10 and disposed so as to be adjacent to the left side (+X direction side) of the area on which the six switching elements SW are mounted.

The bus bar support member 20 is disposed in a position at a predetermined distance from the circuit board surface on the back surface side of the circuit board main portion 10 (see FIG. 4). Three bus bars corresponding to each of the U phase, the V phase, and the W phase are mounted in the bus bar support member 20.

The three bus bars mounted in the bus bar support member 20 extend from bus bar connection terminals $20a$ located on the lower end side (−Y direction side) of the bus bar support member 20 to high-voltage output terminals $20b$ located on the upper end side (+Y direction side) of the bus bar support member 20 while maintaining a constant distance from the circuit board surface of the circuit board main portion 10. At this time, the above-described three bus bars are disposed so as to cross over the high-voltage circuit $10a$ mounted from the left end side to the right end side of the circuit board surface of the circuit board main portion 10.

The three bus bars mounted in the bus bar support member 20 are electrically connected to wiring mounted on the circuit board surface of the circuit board main portion 10 at the bus bar connection terminals $20a$. The AC power of each phase generated by driving the switching elements SW to be turned on or turned off is input to each corresponding bus bar via the bus bar connection terminal $20a$. The AC power corresponding to each of the U phase, the V phase, and the W phase is output from the high-voltage output terminal $20b$ of each phase through the bus bar that extends from the bus bar connection terminal $20a$ located on the lower end side of the bus bar support member 20 to the upper end side thereof.

In this way, when the power conversion circuit board 1 is seen from the bottom surface side, wiring of the high-voltage circuit $10a$ from the high-voltage input terminals $10a1$ to the switching elements SW and wiring thereof from the switching elements SW to the high-voltage output terminals $20b$ are disposed so as to cross each other in the high-voltage circuit $10a$ mounted on the power conversion circuit board 1.

The circuit board main portion 10 includes a plurality of series capacitor groups $10a3$, each of which is a capacitor element provided for the purpose of reducing electromagnetic noise, connected between the power source wiring to which a high voltage in the high-voltage circuit $10a$ is applied and the ground wiring that is grounded. The series capacitor group $10a3$ is formed of a plurality of (for example, five) capacitor elements (for example, the order of several thousand pF per one element) that are connected in series (see FIGS. 2 and 3). Each of the capacitor elements may be, for example, a general ceramic capacitor.

As illustrated in, for example, FIGS. 2 and 3, in the present embodiment, the series capacitor groups $10a3$ are mounted in the same positions (positions overlapping with each other when seen from the +Z direction side or the −Z direction side) on each of the front surface side (surface on the +Z direction side) of the circuit board main portion 10 and the back surface side (surface on the −Z direction side) of the circuit board main portion 10. Two groups of the series capacitor groups $10a3$ mounted in the same positions on the front surface side and the back surface side are mounted such that the plurality of capacitor elements have the same arrangement pattern.

The circuit board main portion 10 according to the first embodiment is provided with fixing holes 11 for attaching the circuit board main portion 10 to a housing of the electric compressor, which is not illustrated. The power conversion circuit board 1 is screwed to the housing of the electric compressor through the fixing holes 11.

One fixing hole 11 is provided in each of four corners of the circuit board main portion 10, and the plurality of fixing holes 11 are also provided near the center of the circuit board main portion 10 (see FIGS. 2 and 3). A grounding land $11a$ connected to the ground wiring is provided at the edge of the fixing hole 11. In this way, by being screwed through the fixing holes 11, the power conversion circuit board 1 is grounded through the grounding land $11a$ provided at the edge of the fixing hole 11.

Furthermore, the series capacitor group $10a3$ described above is mounted in the vicinity of the fixing hole 11 corresponding to each of the fixing holes 11 (see FIGS. 2 and 3).

Characteristics of Series Capacitor Group

Figure 6A:
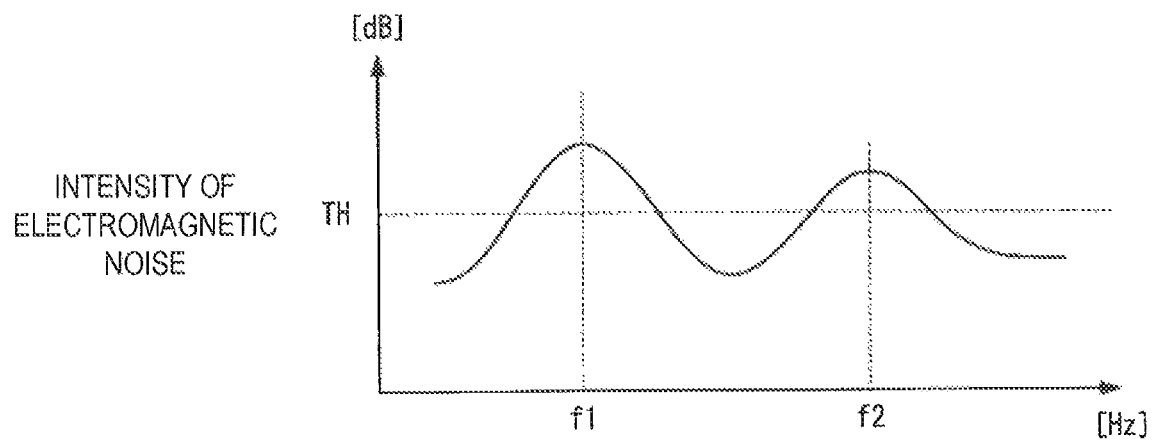
FIG. 6A is a first drawing for explaining characteristics of a series capacitor group according to the first embodiment.

FIG. 6A is a first drawing for explaining characteristics of a series capacitor group according to the first embodiment.

Figure 6B:
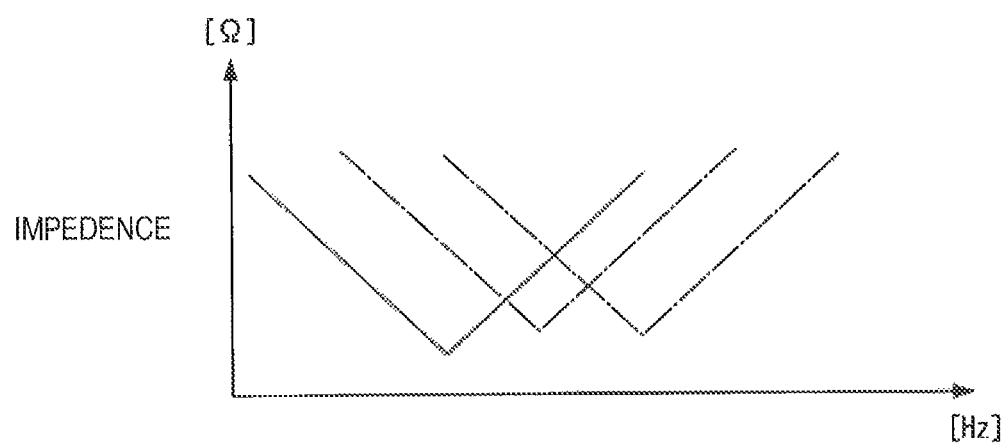
FIG. 6B is a second drawing for explaining characteristics of the series capacitor group according to the first embodiment.

FIG. 6B is a second drawing for explaining characteristics of the series capacitor group according to the first embodiment.

A graph shown in FIG. 6A shows an example of frequency characteristics of electromagnetic noise generated by the power conversion circuit board 1 (the vertical axis shows intensity of noise [dB] and the horizontal axis shows frequency [Hz]). A graph shown in FIG. 6B shows an example of frequency characteristics of impedance of each of the capacitor elements that form the series capacitor group 10a3 (the vertical axis shows impedance [Ω] and the horizontal axis shows frequency [Hz]).

The electromagnetic noise emitted from the power conversion circuit board 1 herein has frequency characteristics peculiar to a product due to, for example, characteristics of mounted elements, their circuit patterns, applied voltage, and operating frequency. For example, as shown in FIG. 6A, the electromagnetic noise of the power conversion circuit board 1 shows intensity higher than a prescribed value TH at a plurality of different frequencies f1, f2.

In this case, the five capacitor elements that form the series capacitor group 10a3 are selected so as to reduce the electromagnetic noise at the plurality of frequencies f1, f2 at which the electromagnetic noise is higher than or equal to the prescribed value TH corresponding to the plurality of frequencies f1, f2.

Specifically, the impedance (Ω) of the capacitor element has frequency characteristics as shown in FIG. 6B. In other words, the impedance locally decreases in a frequency band due to resonance characteristics.

The frequency characteristics of the impedance of the capacitor element differ from one another depending on a kind of a selected capacitor element. Thus, the frequency characteristics of the different impedance of each of the capacitor elements that form the series capacitor group are combined corresponding to the frequencies f1, f2 at which the electromagnetic noise is intense. This can effectively reduce the electromagnetic noise at a desired frequency (such as the frequencies f1, f2).

Operational Effects

Figure 7:
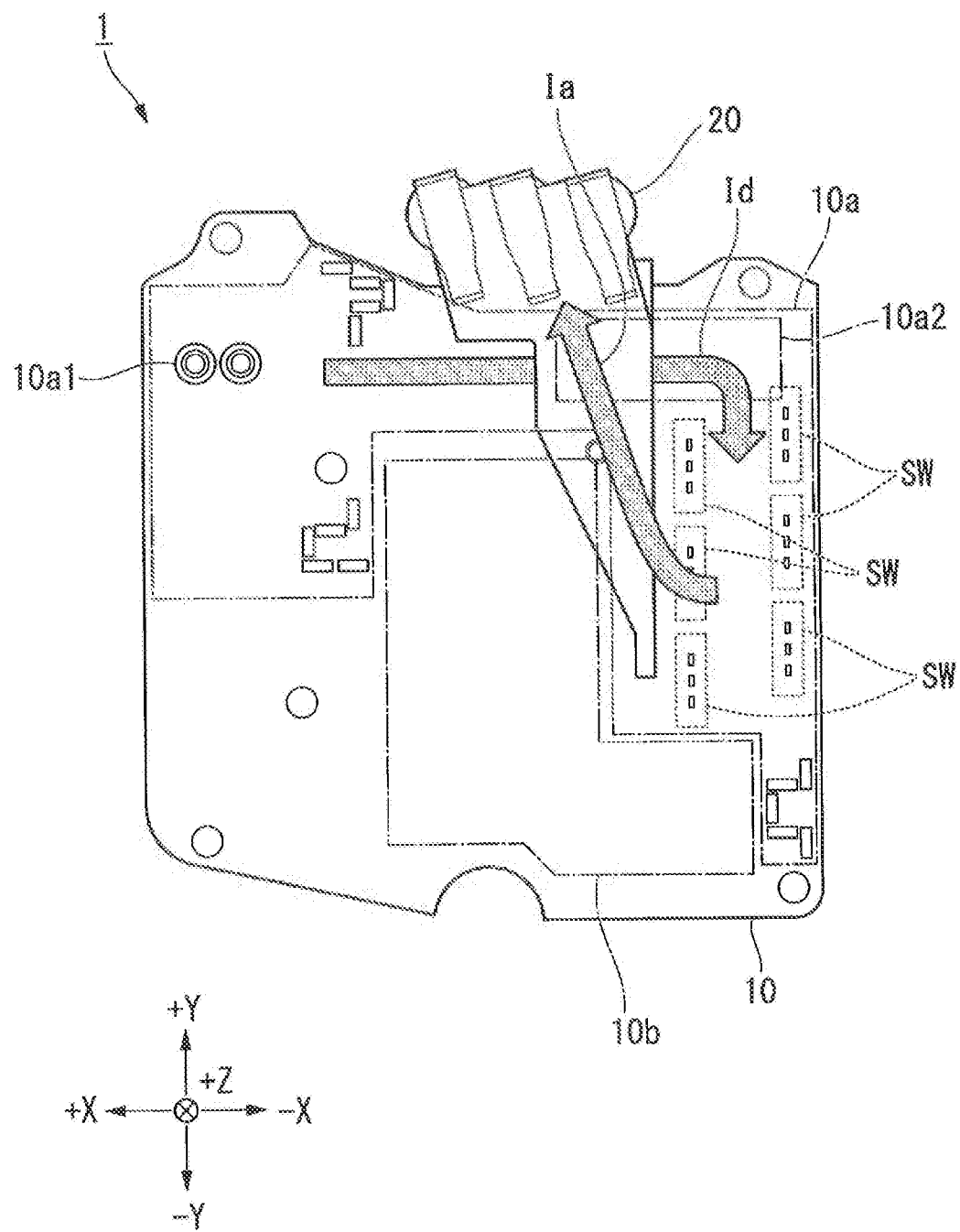
FIG. 7 is a drawing for explaining operational effects based on a structure of a high-voltage circuit according to the first embodiment.

FIG. 7 is a drawing for explaining operational effects based on a structure of a high-voltage circuit according to the first embodiment.

As illustrated in FIG. 7, the power conversion circuit board 1 according to the first embodiment is characterized in that the low-voltage circuit 10b to which a low voltage is applied and the high-voltage circuit 10a to which a high voltage is applied are separately disposed in the different areas on the same circuit board surface.

In this way, the high-voltage circuit 10a and the low-voltage circuit 10b are separately disposed. This can reduce a degree of interference of the electromagnetic noise emitted from the high-voltage circuit 10a with the low-voltage circuit 10b. Furthermore, the high-voltage circuit 10a and the low-voltage circuit 10b are disposed on the same circuit board surface, which can thus save space.

As described above, the power conversion circuit board 1 can reduce an influence of the electromagnetic noise while saving space.

In the power conversion circuit board 1 according to the first embodiment, as illustrated in FIG. 7, the wiring of the high-voltage circuit 10a from the high-voltage input terminals 10a1 to the switching elements SW (wiring through which a direct current 1d flows) is formed on the circuit board surface of the circuit board main portion 10 while the wiring thereof from the switching elements SW to the high-voltage output terminals 20b (wiring through which an alternating current 1a flows) is constituted by the bus bar provided at the predetermined distance from the circuit board surface.

In this way, the electromagnetic noise (such as ringing noise) generated by driving the switching elements SW is absorbed between the wiring formed on the circuit board surface of the circuit board main portion 10 and the bus bar provided at the predetermined distance from the circuit board surface in addition to the RC circuit 10a2. This can suppress the electromagnetic noise to be emitted to the outside.

In the power conversion circuit board 1 according to the first embodiment, the wiring from the high-voltage input terminals 10a1 to the switching elements SW and the wiring from the switching elements SW to the high-voltage output terminals 20b are disposed so as to cross each other. That is to say, the wiring of the high-voltage circuit 10a through which the direct current 1d flows (wiring mounted on the circuit board surface of the circuit board main portion 10a) and the wiring of the high-voltage circuit 10a through which the alternating current 1d flows (bus bar supported by the bus bar support member 20) three-dimensionally cross each other in the structure.

In this way, the electromagnetic noise generated by driving the switching elements SW is effectively absorbed by a portion where the wirings cross with each other. This can further suppress the electromagnetic noise to be emitted to the outside.

The above-described structure in which the wirings three-dimensionally cross with each other allows the region of the power conversion circuit board 1 occupied by the high-voltage circuit 10a to be compact and integrated into one. Therefore, the whole power conversion circuit board 1 can be further reduced in size (can further save space).

In the power conversion circuit board 1 according to the first embodiment, at least part of the RC circuit 10a2 is provided in a space between the wiring from the high-voltage input terminals 10a1 to the switching elements SW and the wiring from the switching elements SW to the high-voltage output terminals.

In this way, the effect of eliminating the electromagnetic noise can be obtained on the basis of the function of the RC circuit 10a2 as a low-pass filter. Furthermore, the space provided between the wiring from the high-voltage input terminals 10a1 to the switching elements SW and the wiring from the switching elements SW to the high-voltage output terminals can be effectively used to secure space needed for mounting the RC circuit 10a2. Therefore, the power conversion circuit board 1 can further save space.

The power conversion circuit board 1 according to the first embodiment is characterized in that the high-voltage circuit 10a includes the series capacitor groups 10a3 each formed of the plurality of capacitor elements connected in series between the power source wiring and the ground wiring.

In this way, the voltage applied to one capacitor element is divided and reduced, so that the high-voltage circuit 10a can have higher withstand voltage characteristics. Even if one of the capacitor elements is destroyed and short-circuited, the other capacitor elements connected in series can prevent a short circuit between the power source wiring and the ground wiring.

Also in this way, each of the capacitor elements that form the series capacitor group 10a3 can be selected as desired, so that the impedance characteristics of the whole series capacitor group 10a3 can be appropriately controlled according to the electromagnetic noise peculiar to a product.

As described above, an influence of the electromagnetic noise on the external device can be reduced, and the withstand voltage characteristics can be further increased.

In the power conversion circuit board 1 according to the first embodiment, each of the capacitor elements that form the series capacitor group 10a3 has different impedance characteristics (frequency characteristics of impedance) capable of reducing the electromagnetic noise at the plurality of frequencies at which the electromagnetic noise is higher than or equal to the prescribed value TH (FIG. 6A), corresponding to the plurality of frequencies.

Thus, the frequency characteristics of the different impedance are combined corresponding to the frequencies at which the electromagnetic noise is intense (the frequencies f1, f2 in FIG. 6A). This can effectively reduce the electromagnetic noise at a desired frequency.

In the power conversion circuit board 1 according to the first embodiment, the series capacitor groups 10a3 are mounted in the same positions on each of the front surface side and the back surface side of the circuit board main portion 10.

Two groups of the series capacitor groups 10a3 mounted in the same positions on the front surface side and the back surface side of the circuit board main portion 10 are mounted such that the plurality of capacitor elements have the same arrangement pattern.

It is assumed that a floating capacitance according to each of the positional relationships is formed between the capacitor elements. Therefore, with the same arrangement pattern, the series capacitor groups 10a3 on the front surface side and the back surface side can have the same capacitance value, which also includes the floating capacitance according to the arrangement pattern.

In the power conversion circuit board 1 according to the first embodiment, the fixing holes 11 are formed in at least four corners of the circuit board surface and in the area (near the center) other than the four corners, and the grounding land 11a provided at the edge of the fixing hole 11 is formed.

In this way, positions for being screwed are increased. This not only improves the fixing performance of the power conversion circuit board 1 to the housing of the electric compressor, but also further stabilizes a ground potential of the ground wiring because the positions grounded through the grounding land 11a are distributed on the whole circuit board surface. Therefore, an influence of the electromagnetic noise on the external device can be reduced, and the vibration resistance can be further increased.

In the power conversion circuit board 1 according to the first embodiment, the plurality of series capacitor groups 10a3 are mounted in the vicinity of the fixing holes 11.

In this way, a position grounded through the land provided at the edge of the fixing hole 11 is close to a position connected to the series capacitor group 10a3 on the ground wiring in the high-voltage circuit 10a. This further stabilizes the ground potential of the whole ground wiring of the high-voltage circuit 10a, and thus an influence of the electromagnetic noise on the external device can be further suppressed.

Modification of First Embodiment

Details have been described above for the power conversion circuit board 1 according to the first embodiment so far, but the specific aspects of the power conversion circuit board 1 should not be construed to be limited thereto, and a variety of design modifications can be made without departing from the gist.

For example, it has been described in the first embodiment that the wiring from the high-voltage input terminals 10a1 to the switching elements SW and the wiring from the switching elements SW to the high-voltage output terminals 20b are disposed so as to cross with each other in the power conversion circuit board 1, but a configuration is not limited to such a configuration in the other embodiments.

In other words, the wiring from the high-voltage input terminals 10a1 to the switching elements SW and the wiring from the switching elements SW to the high-voltage output terminals 20b may not necessarily cross with each other in the power conversion circuit board 1 according to the other embodiments. For example, at least part of both wirings may overlap with each other and extend.

Furthermore, it has been described in the first embodiment that the RC circuit 10a2 is connected for the purpose of reducing the electromagnetic noise in response to the drive of the switching elements SW in the power conversion circuit board 1, but a configuration is not limited to this aspect in the other embodiments.

In other words, the power conversion circuit board 1 according to the other embodiments may not include the RC circuit 10a2. Also in this case, the power conversion circuit board 1 according to the other embodiments may only include a land on which the RC circuit 10a2 can be mounted.

In this way, providing only a region for mounting the RC circuit 10a2 allows the selection of whether to mount or not to mount the RC circuit 10a2 according to customer needs (a degree of the electromagnetic noise, which should be reduced).

While certain embodiments have been described, these embodiments have been presented by way of example only, and are not intended to limit the scope of the invention. The embodiments described herein may be embodied in a variety of other forms and, furthermore, various omissions, substitutions and changes may be made without departing from the spirit of the invention. The accompanying claims and their equivalents are intended to cover such embodiments or modifications as would fall within the scope and spirit of the invention.

INDUSTRIAL APPLICABILITY

The power conversion circuit board and the electric compressor described above can reduce an influence of the electromagnetic noise while saving space.

REFERENCE SIGNS LIST

1 Power conversion circuit board
10 Circuit board main portion
10a High-voltage circuit
10a1 High-voltage input terminal
10a2 RC circuit
10a3 Series capacitor group
10b Low-voltage circuit
11 Fixing hole
20 Bus bar support member
20a Bus bar connection terminal
20b High-voltage output terminal
SW Switching element
C Capacitor
L Inductor

The invention claimed is:

1. A power conversion circuit board that is a circuit board on which a power conversion circuit configured to convert a direct current into an alternating current is mounted, wherein
a low-voltage circuit to which a low voltage is applied and a high-voltage circuit to which a high voltage is applied are disposed in different areas on the same circuit board surface,
wherein the high-voltage circuit includes series capacitor groups which are connected to ground wiring and includes a capacitor element whose ends are each connected to other capacitor elements, the series capacitor group including a plurality of capacitor elements connected in series and being formed in a two-dimensional arrangement pattern which includes U-shape, such that the series capacitor groups reduce electromagnetic noise at a plurality of frequencies at which electromagnetic noise is higher than or equal to a prescribed value, for a frequency range.

2. The power conversion circuit board according to claim 1, wherein fixing holes are formed at least in four corners of the circuit board surface and in an area other than the four corners, and a grounding land provided at an edge of each of the fixing holes is formed.

3. The power conversion circuit board according to claim 2, wherein the series capacitor groups are mounted in the vicinity of the fixing holes.

4. The power conversion circuit board according to claim 1, wherein wiring of the high-voltage circuit from high-voltage input terminals to switching elements is formed on the circuit board surface while wiring of the high-voltage circuit from the switching elements to high-voltage output terminals is constituted by a bus bar provided at a predetermined distance from the circuit board surface.

5. The power conversion circuit board according to claim 4, wherein the wiring from the high-voltage input terminals to the switching elements and the wiring from the switching elements to the high-voltage output terminals are disposed crossing each other.

6. An electric compressor, comprising:

the power conversion circuit board according to claim 1; and a motor configured to operate on the basis of an AC power supplied from the power conversion circuit board.

* * * * *